United States Patent [19]

Takizawa

[11] Patent Number: 5,506,176

[45] Date of Patent: Apr. 9, 1996

[54] METHOD OF MAKING A SEMICONDUCTOR DEVICE HAVING A PROCESS OF HYDROGEN ANNEALING

[75] Inventor: Ritsuo Takizawa, Tokyo, Japan

[73] Assignee: Sony Corporation, Tokyo, Japan

[21] Appl. No.: 159,566

[22] Filed: Dec. 1, 1993

[30] Foreign Application Priority Data

Dec. 7, 1992 [JP] Japan .................................... 4-326930
Apr. 2, 1993 [JP] Japan .................................... 5-076893

[51] Int. Cl.$^6$ ................................................ H01L 21/324
[52] U.S. Cl. ........................... 437/247; 437/937; 437/946
[58] Field of Search ............................ 437/53, 247, 937, 437/939, 941, 946, 974; 148/DIG. 3, DIG. 17

[56] References Cited

U.S. PATENT DOCUMENTS 3,506,508  4/1970  Nickl ........................................ 437/939
4,735,679  4/1988  Lasky ........................................ 437/974
5,089,441  2/1992  Moslehi ...................................... 437/937

OTHER PUBLICATIONS

Fowler et al., "MOSFET device with high-gate dielectric integrity", IBM TDB, vol. 17, No. 1, Jun. 1974.
Wolf, "Silicon Processing for the VLSI Era", vol. 1, Process Technology, 1986.

Primary Examiner—Chandra Chaudhari
Attorney, Agent, or Firm—Hill, Steadman & Simpson

[57] ABSTRACT

Not only a thermal donor ($Si_xO_y$ cluster) that exists in the state presented immediately after the crystal growth but also a fine oxide precipitate, a point defect cluster or the like can be erased during the process of making a semiconductor wafer. During the slicing process of a semiconductor ingot to the rinsing process after the semiconductor wafer had been polished, preferably, after a damage caused by the lapping work or impurity had been removed by the etching work and before the semiconductor wafer is polished in the final polishing process, the semiconductor wafer is subjected to a heat treatment in a gas ambient containing hydrogen at a temperature higher than 500° C., preferably at a temperature ranging from 900° C. to 1250° so that defects can be decomposed.

5 Claims, 5 Drawing Sheets

FIG. 5A
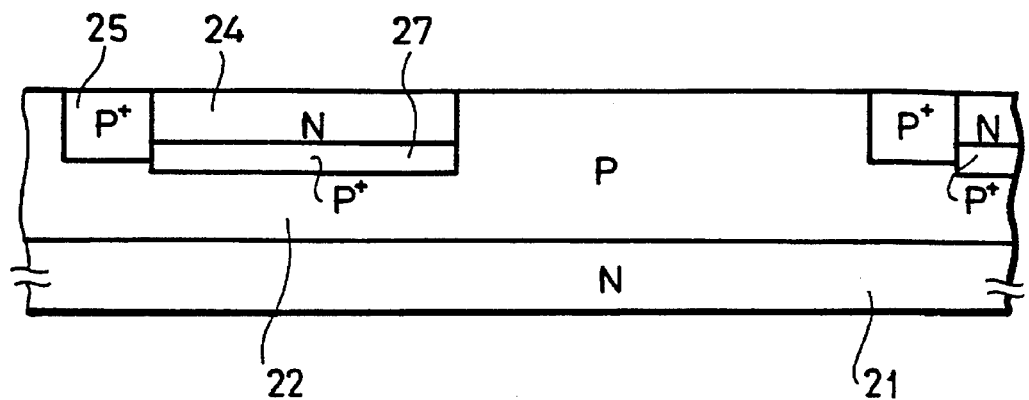
FIG. 5B
Annealing Process
(100% H₂, 1000°C, 30 Minutes)
FIG. 5C
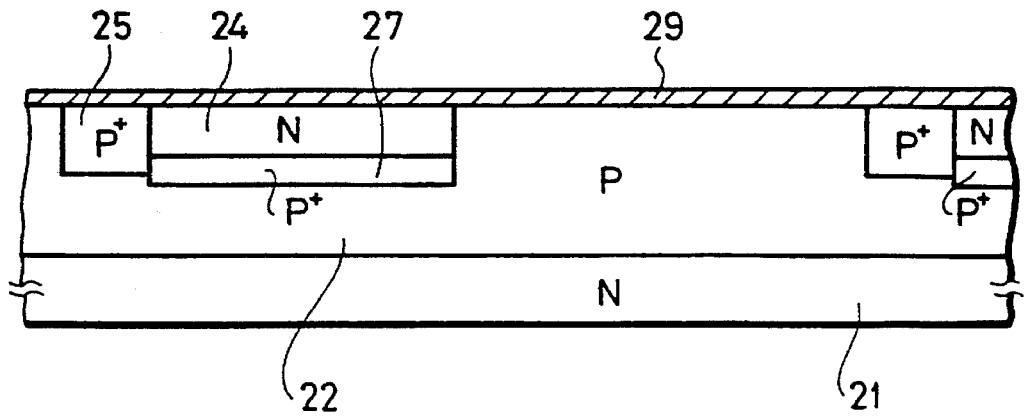

FIG. 5D
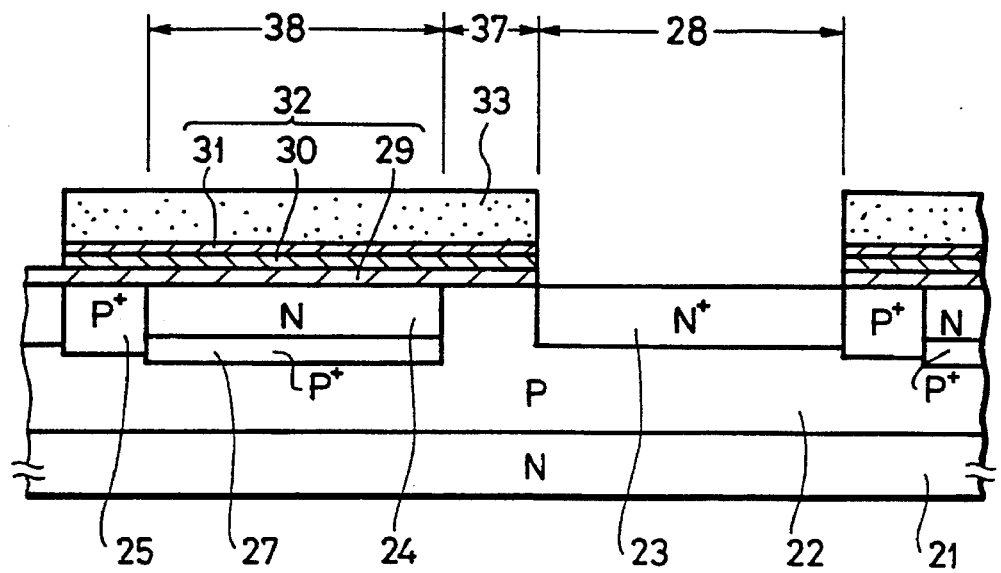
FIG. 5E
Annealing Process
(100% H2, 1000°C, 30 Minutes)
FIG. 5F
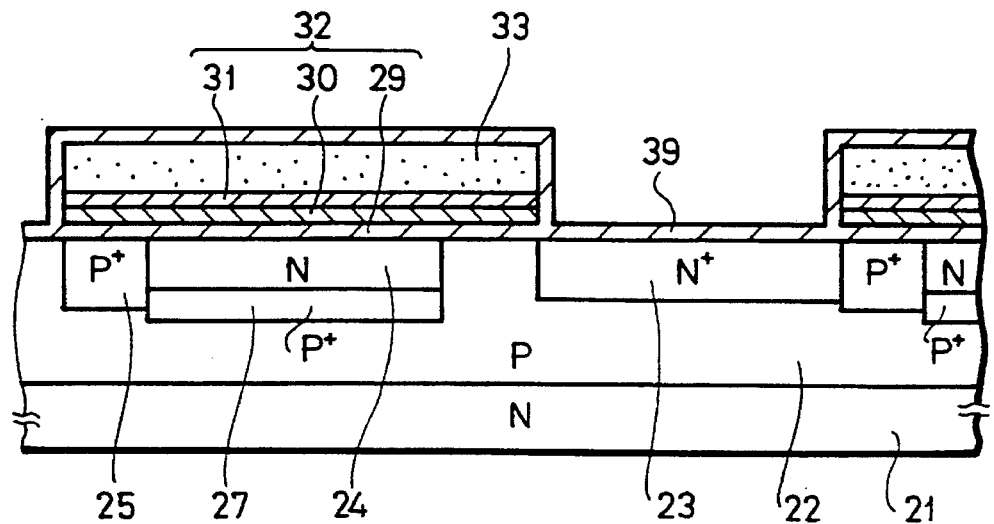

METHOD OF MAKING A SEMICONDUCTOR DEVICE HAVING A PROCESS OF HYDROGEN ANNEALING

BACKGROUND OF THE INVENTION

1. Field of the Invention

The present invention relates to a method for preparing a semiconductor substrate for use in the fabrication of a semiconductor device, and further relates to a method for fabricating a solid state imaging device.

2. Description of the Prior Art

A silicon wafer widely used as a semiconductor substrate in fabrication of such a semiconductor device as a very large scale integrated circuit (VLSI) is known as a wafer having a superhigh purity. However, the silicon wafer actually contains ppm levels of oxygen and carbon and ppt levels of heavy metal impurities such as iron and nickel or the like. Of these impurities, oxygen having the highest concentration is contained as solubilized in a supersaturated state. As a consequence, when such oxygen is subjected to a thermal history process (cooling process) immediately after the single crystalline growth by a pulling method or the like, oxygen precipitates as fine oxygen precipitate or sometimes forms secondary crystal defects (such as dislocation and stacking fault or the like), which deteriorates characteristics of the semiconductor device.

Also, the crystal immediately after having been subjected to the single crystalline growth contains, in addition to the aforementioned impurities, point defects and resultant clusters caused by the thermal fluctuations on the growth interface, which are also one of the causes of deteriorating the semiconductor device characteristics.

Of the defects present in the semiconductor crystal immediately after such a growth as mentioned above, the thermal donors (which are considered as $Si_xO_y$ clusters) resulting from the oxygen precipitation are known to be removed by subjecting the crystal to an annealing process with use of an $N_2$ gas at a temperature in a range from 700° to 1000° C. for a period of time in a range from 10 to 30 minutes. In general, this removal of the thermal donors is carried out after an etching process in the processing steps of the semiconductor wafer.

Meanwhile, such defects as mentioned above are present even in the fabrication of a solid state imaging device. FIG. 1 shows an example of a solid state imaging device of charge coupled device (CCD) type. The CCD type solid state imaging device is formed in the following manner. That is, within a first p-type well region 22 formed on a surface of an n-type silicon substrate 21, there are formed an n-type impurity diffusion region 23 forming a photo sensor 28, an n-type transfer channel region 24 forming a vertical register 38 and a p-type channel stop region 25. A p-type positive charge accumulation region 26 is formed on the n-type impurity diffusion region 23, while a second p-type well region 27 is formed beneath the n-type transfer channel region 24.

In this example, the photo sensor 28 is formed by a photodiode which is constituted by a PN junction between the n-type impurity diffusion region 23 and the first p-type well region 22. This photo sensor 28 is formed in correspondence with a picture element.

A transfer electrode 33 constituted by a polycrystalline silicon layer is formed on a gate insulating film 32 laying over the transfer channel region 24 and the channel stop region 25, whereby the vertical register 38 is constituted by the transfer channel region 24, the gate insulating film 32 and the transfer electrode 33.

An interlayer insulating film 34 made of phosphor-silicate glass (PSG) or the like is formed on the transfer electrode 33 and on an insulating film 29 which is formed on the positive charge accumulation region 26. A light shielding film 35 made of aluminum is selectively formed on the interlayer insulating film 34 which is formed on the transfer electrode 33. Reference numeral 37 denotes a reading gate portion.

The gate insulating film 32 of the vertical register 38 is formed of a multi-layer film which is constituted by the $SiO_2$ film 29, an $Si_3N_4$ film 30 and an $SiO_2$ film 31. The insulating film 29 of the photo sensor 28 is formed by an $SiO_2$ film.

An annealing process using nitrogen gas called the aforementioned thermal donor killer (TD killer) annealing process has effect only on the decomposition of the $Si_xO_y$ clusters but has no effect on the fine oxygen precipitate, the point defect cluster or the like.

Meanwhile, a CCD type solid state imaging element shown in FIG. 2 has a silicon substrate 21 formed by a wafer made by a Czochralski (CZ) method, a magnetic-field-applied Czochralski (MCZ) method, an epitaxial wafer method or the like. In the prior art, however, fine defects caused by the oxygen introduced during crystal growth, point defects or clusters caused by the thermal fluctuations on the growth interface, or metallic impurities (especially, in the case of the epitaxial growth process) introduced from the atmosphere or ambient are already present in the silicon wafer 21 serving as a starting material. Further, secondary defects (e.g., oxygen precipitate, oxidation-included stacking fault (OSF) or dislocation or the like) are introduced during the fabricating process of the solid state imaging device. As a consequence, the aforementioned defects A, B (represented by marks x) will exist in the gate insulating film 32 of the vertical register 38 or in the photodiode portion of the photo sensor 28 in FIG. 1.

These defects, which are not less, will badly affect on the electrical characteristics of the actually fabricated solid state imaging device. That is, these defects lead to the following problems:

(1) A leak current at the interface of the PN junction is increased and a dark current is locally increased, whereby white defects (defects or error appearing as white points on the screen) as one of defects on the screen of the imaging element tend to occur (defect B).

(2) A transfer failure caused by the deterioration of breakdown voltage or deterioration of transfer characteristics or the like due to an increase in the interface state (defect A) occurs at the interface of the gate insulating film 32 and silicon substrate.

OBJECTS AND SUMMARY OF THE INVENTION

Therefore, it is an object of the present invention to provide an improved method for preparing a semiconductor substrate or wafer and a solid state imaging device in which the aforementioned shortcomings and disadvantages encountered with the prior art can be eliminated.

More specifically, it is an object of the present invention to provide a process for preparing a semiconductor substrate or wafer which can eliminate not only thermal donors but also fine oxygen precipitates, point defect clusters and the like during preparing process of the semiconductor substrate.

Another object of the present invention is to provide a process for manufacturing a solid state imaging device which can reduce white defects appearing on the screen of the imaging device and which also can reduce a transfer failure caused by the deterioration of a gate insulating film and so on.

As an aspect of the present invention, there is provided a process for preparing a semiconductor wafer which includes the step of annealing the semiconductor wafer in a hydrogen ambient in a process of fabricating the semiconductor wafer after a slicing process.

Preferably, the annealing ambience includes a hydrogen gas or a forming gas.

Further, preferably, the annealing step is performed at a temperature more than 500 degrees centigrade.

As another aspect of the present invention, there is provided a process for producing a solid state imaging device formed on a semiconductor body which includes the step of annealing the semiconductor body in an annealing ambient.

Preferably, the annealing step is performed at a temperature between 700 and 1,250 degrees centigrade.

Further, preferably, a gate insulating layer is formed on the semiconductor body after the annealing step.

Furthermore, preferably, the annealing step is performed when the semiconductor body is bare.

Furthermore, preferably, the annealing step is performed when an insulating layer on a sensor region is etched away and the semiconductor body is bare in part.

In a process for preparing a semiconductor substrate or wafer in accordance with the present invention, preferably, since a semiconductor substrate is subjected to an annealing process in an ambient containing hydrogen during a period of time from a slicing step to a cleaning step after a polishing step, not only $Si_xO_y$ clusters being present immediately after the growth of the crystal but also fine oxygen precipitates, point defect clusters and the like can be removed.

This detailed mechanism is not clear so far, but may be considered as follows.

(a) Since hydrogen is introduced into the semiconductor substrate, the rate of oxygen outward diffusion is increased so that the thermal dissociation of defects such as not only $Si_xO_y$ clusters but fine oxygen precipitates and point defect clusters is promoted.

(b) Direct reduction of hydrogen causes these defects to disappear.

These phenomenon are more effective when 100% of hydrogen gas or forming gas is used as the ambient. Further, the higher the hydrogen concentration is, the greater the effect is.

When the annealing temperature is more than 500° C., the aforementioned defects are decomposed and disappear. However, it is preferable that the annealing temperature is set at a level in a range of from 900° to 1250° C., in which case the defects can be surely decomposed and removed.

In a process for preparing a solid state imaging element in accordance with another aspect of the present invention, the semiconductor substrate is subjected to an annealing process in an ambient containing hydrogen, so that fine oxygen precipitates, $Si_xO_y$ clusters, and secondary defects (such as OSF and dislocation) can be reduced.

When the annealing temperature is set at a temperature in a range from 700° to 1250° C., these defects can be surely reduced.

In the above process for preparing a solid state imaging element, when the semiconductor substrate is subjected to an annealing process in an ambient containing hydrogen and then an insulating film is formed on a photo sensor, defects in the photo sensor can be reduced and hence white defects on the screen of the imaging device can be reduced.

The preceding and other objects, features, and advantages of the present invention will become apparent from the following detailed description of illustrative embodiments thereof when read in conjunction with the accompanying drawings, in which like reference numerals are used to identify the same or similar portions in the several views.

BRIEF DESCRIPTION OF THE DRAWINGS

FIGS. 5A to 5F are schematic diagrams showing an example of processes for preparing a solid state imaging device according to the present invention, respectively.

DETAILED DESCRIPTION OF THE PREFERRED EMBODIMENTS

Figure 1:
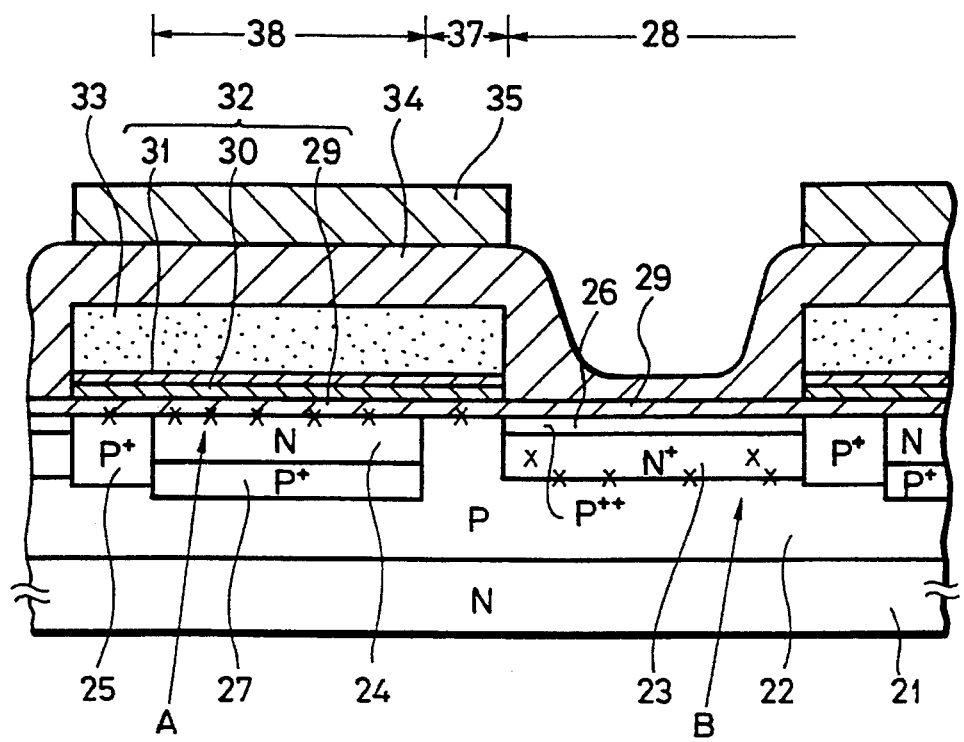
FIG. 1 is a schematic sectional diagram showing a structure of an example of a CCD type solid state imaging device.

A method for preparing a semiconductor wafer and a solid state imaging device according to the present invention will hereinafter be described with reference to the accompanying drawings.

First, a process for preparing a semiconductor substrate or wafer according to an embodiment of the present invention will be explained referring to FIG. 3. First of all, a silicon ingot 10 is obtained through the crystal growth process using the CZ method. The silicon ingot 10 has, for example, a diameter of 6 inches, a crystal orientation <100>, and also has phosphor doped therein. A specific resistance or resistivity (design value) of the silicon ingot 10 is in a range from 8 to 12 Ωcm, its oxygen concentration Oi satisfies $[Oi] \approx 1.5 \times 10^{18}$ atoms/cm³, and its carbon concentration Cs satisfies $[Cs] < 1 \times 10^{16}$ atoms/cm³. After pulling up the ingot 10, it is subjected to a polishing work so as to have a cylindrical configuration in order to determine its diameter as the ingot 10, subjected to a crystal face orientating and forming an orientation flat.

Then, in a slicing process 1, the silicon ingot 10 is sliced by a slicing blade 11 with an inner periphery blade in a known manner to obtain a silicon wafer 10A.

In the next beveling process 2, a grinding wheel 12 is pushed against the silicon wafer 10A to chamfer it.

In a lapping process 3, next, in order to remove a damage of the silicon wafer 10A or its irregular thickness during slicing the wafer 10A the silicon wafer 10A is subjected to a lapping work. The lapping work is carried out by mechanically lapping a plurality of such wafers 10A positioned on a carrier 13 by using, e.g., No. 1200 $Al_2O_3$.

Then, in an etching process 4, the wafers 10A are subjected to the etching process to remove damaged portions caused by the lapping process and so on. This etching process is performed by isotropic etching. The etching process is carried out by using an etching solution 14 of a mixture of HF, HNO$_3$ and CH$_3$COOH so that the wafers are etched away by a thickness in a range from 10 to 5 μm at one side.

Subsequently, the silicon wafers 10A are cleaned with use of aqueous solution of NH$_4$OH and H$_2$O$_2$.

After this cleaning process, the silicon wafers 10A are subjected to the annealing process in a gas ambient containing hydrogen according to the present invention. That is, the silicon wafers 10A are disposed within a quartz tube 15, H$_2$ gas 16 is supplied into the tube, and then the wafers are subjected to the annealing process in a gas ambient of 100% of H$_2$ gas 16 supplied thereto, for example, at a temperature of 1050° C. for 30 minutes.

A specific resistance of the wafer, which variations have been large due to the generation of thermal donors prior to the annealing process, becomes stably within a range from 8 to 11 Ωcm after the annealing process. Thus, it will be appreciated that the annealing process can provide a thermal donor killer effect.

Next, in a polishing process 6, the surfaces of the silicon wafers 10A are polished by injecting an abrasive material 17 through primary and secondary polishing processes by an amount of about 8 μm to obtain their mirror finished surfaces. In this figure, reference numeral 18 denotes a plate, and 19 a cloth. Thereafter, in a mirror surface cleaning process 7, the wafers are subjected to a final cleaning work to obtain final semiconductor substrates, i.e., final silicon wafers 10H.

The higher the temperature is and the longer the treatment time is, the annealing process using the hydrogen gas affects up to the more inner part of the wafer 10A. As a consequence, the annealing conditions and polishing conditions must be determined taking such influences into consideration.

Figure 4:
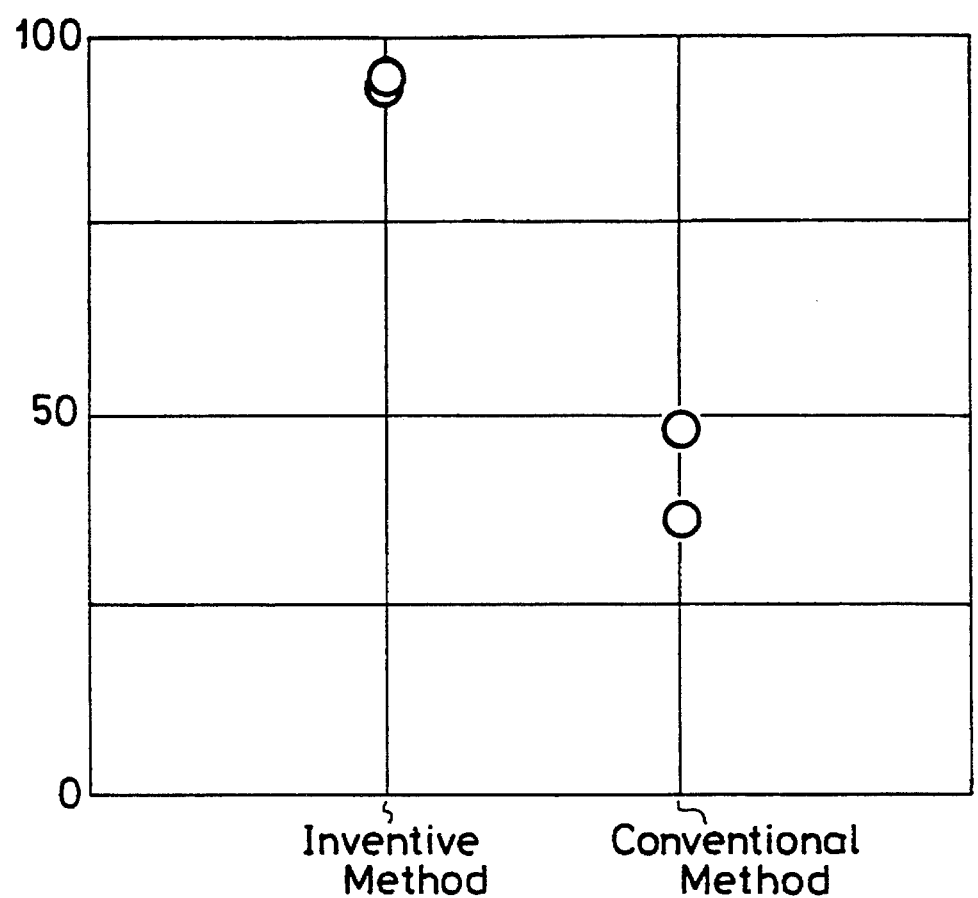
FIG. 4 is a schematic diagram illustrating a good yield according to the present invention and the prior art.

With respect to each of the silicon wafer thus prepared according to the present embodiment and a silicon wafer prepared according to the prior art thermal donor killer annealing process (that is, the wafers are subjected to an annealing operation in an N$_2$ gas ambience at 1050° C. for 30 minutes), a thermally oxidized film (SiO$_2$ film) of 25 nm thick is formed thereon at 1000° C., an Al gate electrode is formed on the oxidized film to thereby form a MOS diode, and then the resultant wafers or diodes are subjected to measurements of their gate breakdown voltage. The measurement results are shown in FIG. 4. In this case, when a gate area of the wafer is set at 0.45 cm$^2$ and a breakdown current is at 5 μA, ones of the wafers having a breakdown electric field of higher than 8 MV/cm were evaluated as good products. It will be seen from FIG. 4 that the gate oxidation film or SiO$_2$ film according to the present embodiment has a remarkably improved breakdown voltage.

According to the aforesaid embodiment, fine oxygen precipitates and point defect clusters can be removed by subjecting the silicon wafer 10A after the etching process 4 to an annealing process in an H$_2$ gas ambience at 1050° C. for 30 minutes. At the same time, the thermal donors can be removed through the above annealing process. As a result, there can be prepared a semiconductor wafer which is free of thermal donors, fine oxygen precipitates and point defects.

The annealing temperature can be set at such a value higher than 500° C. that allows decomposition or removal of such defects, and preferably the annealing temperature is in a range from 900° to 1250° C.

While the wafers have been treated in an ambient containing 100% of H$_2$ gas in the foregoing embodiment, the present invention is not limited to the specific example and the treatment may be carried out in a gas ambience containing a mixture gas such as a forming gas (N$_2$+H$_2$) or the like. In this connection, the higher the hydrogen concentration is, the greater the effect is.

Further, although the hydrogen annealing process according to the present invention may be carried out between the slicing process 1 and the cleaning process 7 after polishing, most preferably the hydrogen annealing process may be performed after the etching step 4 where the damaged portions caused by the lapping process and impurities have been removed through this etching process, and before the final polishing process 6. This is because lots of surface impurities exist on the wafer prior to the etching process, and so, if the annealing process is performed before the etching process, the impurities tend to be diffused into the interior of the wafer through the annealing process. In contrast, if the annealing process is performed after the polishing process, the surface of the wafer possibly becomes highly rough due to the annealing.

While explanation has been made as to the preparing method of the silicon wafers in the above-mentioned embodiment, the present invention may be applied also to preparing methods of other semiconductor wafers.

It has been confirmed that the hydrogen gas can usually work well as the molecular state of the hydrogen annealing process, but the atom or plasma state of hydrogen may also exhibit good effect.

Semiconductor wafers usable in the present invention include ones obtained by the Czochralski (CZ) method, magnetic-field-applied Czochralski (MCZ) method or floating zone (FZ) method or the like.

A method for preparing a solid state imaging device according to another embodiment of the present invention will be described with reference to FIGS. 5A to 5F.

This embodiment corresponds to a case where the present invention is applied to the preparation of a solid state imaging device constituting the CCD type solid state imaging element shown in FIG. 1.

The present embodiment is arranged so that, immediately before forming a gate insulating film for charge transfer, a sensor insulating film to be formed in a photo receptor portion or both the insulating films, a semiconductor wafer is subjected to the annealing process in an ambient containing hydrogen at a temperature higher than 500° C. and desirably in a range between 700° C. and 1250° C. As a consequence, such defects as fine defects in the vicinity of the surface of the wafer and secondary crystalline defects can be suppressed in generation, whereby white defects thereof can be reduced and its gate breakdown voltage can be improved.

As shown in FIG. 5A, first, a well region 22 of a second conductivity type or a first p-type is formed on a silicon substrate (wafer) 21 of a first conductivity type, for example, an n-type, and then an n-type impurity and a p-type impurity are selectively introduced by the ion implantation technique within the first p-type well region 22, thereby forming an n-type transfer channel region 24, a p-type channel stop region 25 and a second p-type well region 27 which constitutes a vertical register.

As shown in FIG. 5B, then, a resultant wafer thus obtained is subjected to the annealing process in a gas ambience containing 100% of H$_2$ gas, for example, at 1000° C. for 30 minutes.

Subsequently, as shown in FIG. 5C, a resultant wafer is subjected to the oxidizing process at 1000° C. to form thereon an SiO$_2$ film 29 of about 30 nm thick.

Then, as shown in FIG. 5D, an $Si_3N_4$ film 30 and an $SiO_2$ film 31 are sequentially formed on the entire surface of the $SiO_2$ film 29, and then the $SiO_2$ film 29, $Si_3N_4$ film 30 and $SiO_2$ film 31 at the portion where a photo sensor 28 is to be formed are selectively etched away. In this respect, a gate insulating film 32 is formed by the n-type transfer channel region 24, a region to be formed as a read gate portion 37, the $SiO_2$ film 29, $Si_3N_4$ film 30 and $SiO_2$ film 31 on the p-type channel stop region 25. Thereafter, a transfer electrode 33 of a polycrystalline silicon layer is formed on the gate insulating film 32, to thereby form a vertical register 38 which is formed of the n-type transfer channel region 24, the gate insulating film 32 and the transfer electrode 33. Thereafter, a region corresponding to the photo sensor 28 is subjected to the ion implantation process to form an n-type impurity diffusion region 23. Though not illustrated, of course, even in the case of processing a horizontal register, the wafer is subjected to the annealing process in the 100%-$H_2$ gas ambient at 1000° C. for 30 minutes prior to the formation of the gate insulating film thereof.

As shown in FIG. 5E, a resultant wafer is again subjected to the annealing process in the 100%-$H_2$ gas ambient at 1000° C. for 30 minutes.

Subsequently, as shown in FIG. 5F, a $SiO_2$ film 39 of about 30 nm thick as a sensor insulating film is formed on a part of the wafer corresponding to the photo sensor 28. At the same time, the $SiO_2$ film 39 is also formed even on the surface of the transfer electrode 33 made of polycrystalline silicon.

Figure 2:
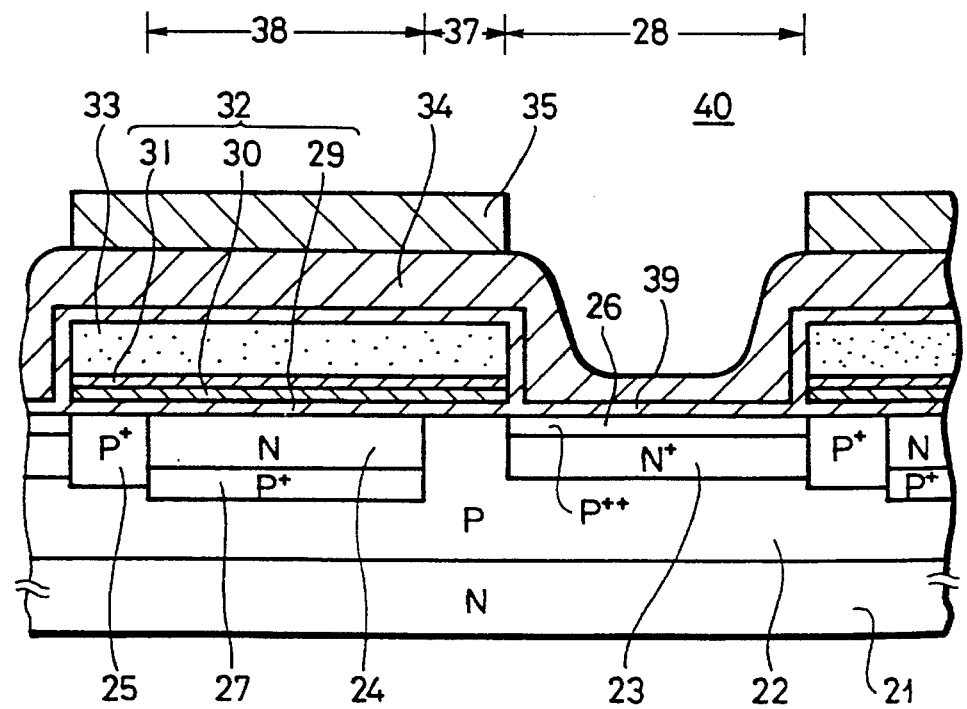
FIG. 2 is a schematic sectional diagram illustrating a structure of another example of the CCD type solid state imaging device.

Thereafter, though not shown in FIG. 5F, a p-type positive-charge accumulation region 26 is formed on the surface of the n-type impurity diffusion region 23 of the photo sensor 28, an interlayer insulating film 34 made of PSG or the like is formed on the entire surface of the wafer including the transfer electrode 33, and then an Al light shielding film 35 is formed to obtain such the CCD type solid state imaging device 40 as shown in FIG. 2.

In accordance with the present embodiment, immediately prior to the formation of the insulating films, that is, immediately prior to the formation of the $SiO_2$ film 29 serving as the gate insulating film and immediately prior to the formation of the $SiO_2$ film 39 serving as the sensor insulating film, the wafer is subjected to the annealing process in the $H_2$ gas ambient at 1000° C. for 30 minutes. Therefore, fine oxygen precipitates present in the surface of the silicon substrate, secondary defects, $Si_xO_y$ clusters and the like can be removed.

As a result, in the photo sensor 28, a leak current flowing through the PN junction forming the photo receptor portion can be reduced, and a dark current can be decreased, and hence white defects as the defects on the screen of the imaging device can be reduced. In the gate insulating film, further, defects in the $SiO_2$ film 29 and in the interface between the $SiO_2$ film 29 and the silicon substrate, and further in the active region under the $SiO_2$ film 29 can be reduced, whereby the breakdown voltage of the gate insulating film can be improved and a transfer failure can be improved.

Figure 3:
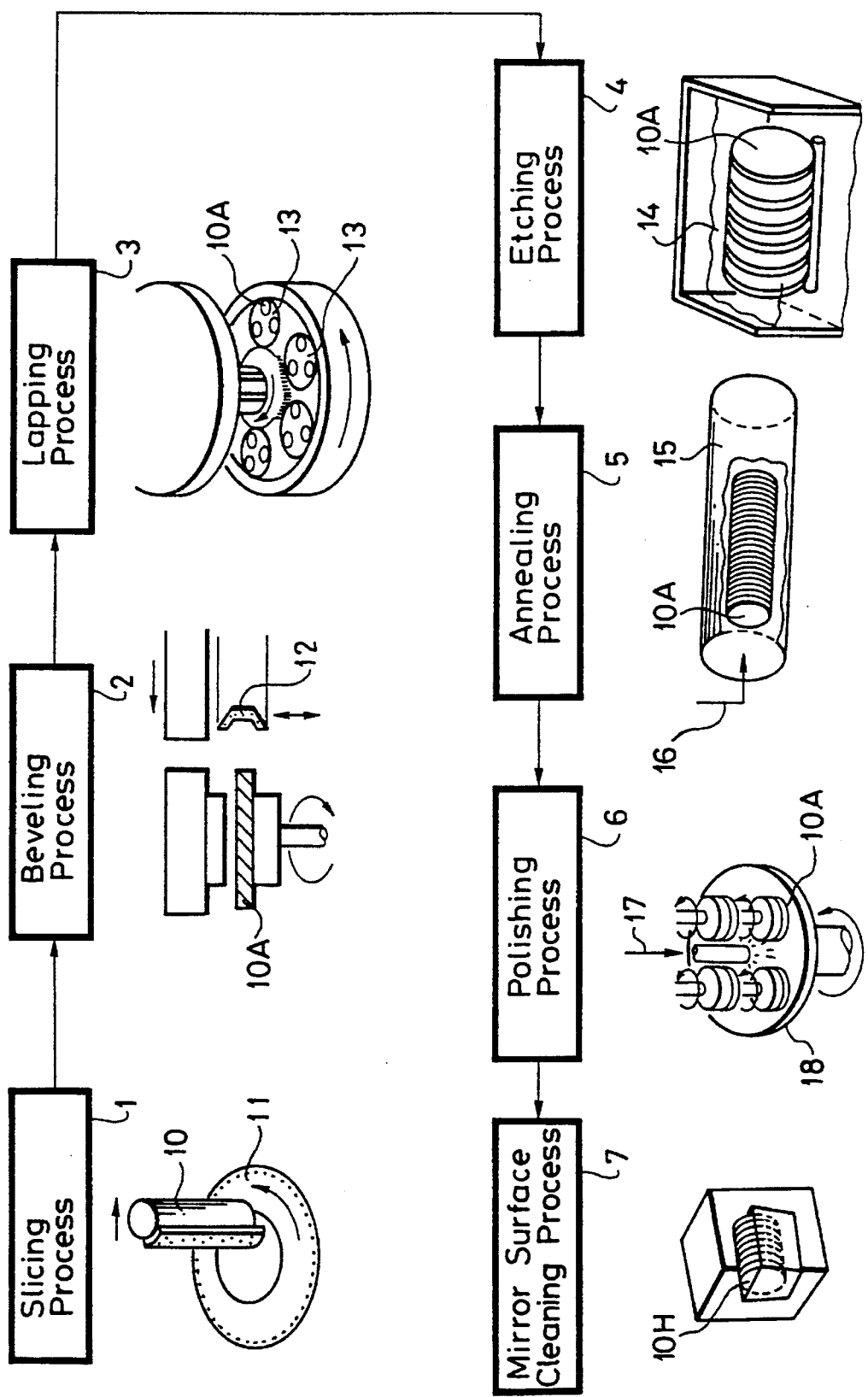
FIG. 3 is a schematic diagram illustrative of an example of a process for preparing a semiconductor substrate according to the present invention.

Although the wafer has been treated in the 100%-$H_2$ gas ambient in the foregoing embodiment, the present invention is not limited to the specific example, and a gas ambience containing a mixture gas ($N_2+H_2$) as a forming gas may be employed like the prior art shown in FIG. 3.

The temperature and time period of the annealing process are arbitrarily determined dependent on the amount and distribution of defects, the hydrogen diffusion length or the like, and on the structure of the imaging devices. The annealing temperature may be set at a value higher than 500° C. and desirably in a range between 700° C. and 1250° C.

The insulating film may comprise only the $SiO_2$ film formed by using the chemical vapor deposition (CVD) technique or the thermal oxidation technique or may comprise a composite film formed by at least the $SiO_2$ film and the $Si_3N_4$ film. The present invention can attain much remarkable effect when employing the former insulating film than the latter.

According to the aforesaid embodiment, the annealing process has been carried out in the ambient containing hydrogen immediately prior to the formation of the gate and sensor insulating films 32 and 39. However, the annealing process may also be effected in the hydrogen-contained ambient only immediately prior to the formation of the gate insulating film 32 or only immediately prior to the formation of the sensor insulating film 29. In this case, enhancement in the breakdown voltage of the gate insulating film, improvement in the transfer deterioration and reduction in white defects as ones on the screen of the imaging device can be realized advantageously.

In accordance with the present invention, there can be prepared a good quality of semiconductor substrate which, through an annealing process in a hydrogen-contained ambient in the course of preparing the semiconductor substrate, can be made free of not only thermal donors ($Si_xO_y$ clusters) present immediately after pulling up of its crystal but also defects such as fine oxygen precipitates and point defect clusters or the like, which removal would be impossible in the prior art.

In a process for preparing a solid state imaging device in accordance with the present invention, an annealing process is carried out in such an ambient as to contains hydrogen immediately prior to the formation of the insulating film, whereby there can be prepared a reliable solid state imaging device which can eliminate fine oxygen precipitates present in the surface of a semiconductor substrate and secondary defects or the like, which removal would be impossible in the prior art, can reduce white defects appearing on the screen of the imaging device and can remove a transfer failure.

Having described the preferred embodiments of the invention with reference to the accompanying drawings, it is to be understood that the invention is not limited to those precise embodiments and that various changes and modifications thereof could be effected therein by one skilled in the art without departing from the spirit or scope of the invention as defined in the appended claims.

What is claimed is:

1. A process for preparing a semiconductor wafer with reduced thermal donors comprising the steps of:

annealing for 30 minutes the semiconductor wafer in a hydrogen-containing ambient to eliminate fine oxygen precipitates and point defect clusters; and then polishing the semiconductor wafer.

2. A process according to claim 1, wherein said annealing is performed after the semiconductor wafer is subjected to an etching process.

3. A process according to claim 1, wherein said annealing is performed at a temperature of 900°–1250° C.

4. A process for preparing a semiconductor wafer according to claim 1, wherein said hydrogen-containing ambient includes a hydrogen gas or a forming gas.

5. A process for preparing a semiconductor wafer according to claim 1, wherein said annealing step is performed at a temperature more than 500 degrees centigrade.

* * * * *